United States Patent
Mrugalski et al.

(10) Patent No.: US 11,423,202 B2
(45) Date of Patent: Aug. 23, 2022

(54) SUSPECT RESOLUTION FOR SCAN CHAIN DEFECT DIAGNOSIS

(71) Applicant: Siemens Industry Software Inc., Plano, TX (US)

(72) Inventors: Grzegorz Mrugalski, Swarzedz (PL); Szczepan Urban, Gowarzewo (PL); Jakub Janicki, Poznan (PL)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 17/007,765

(22) Filed: Aug. 31, 2020

(65) Prior Publication Data

US 2022/0065932 A1 Mar. 3, 2022

(51) Int. Cl.
| | |
|---|---|
| G06F 9/455 | (2018.01) |
| G06F 7/50 | (2006.01) |
| G06F 30/333 | (2020.01) |
| G01R 31/3185 | (2006.01) |
| G01R 31/28 | (2006.01) |
| G01R 31/319 | (2006.01) |

(Continued)

(52) U.S. Cl.
CPC ....... *G06F 30/333* (2020.01); *G01R 31/2834* (2013.01); *G01R 31/31921* (2013.01); *G01R 31/318357* (2013.01); *G01R 31/318536* (2013.01); *G01R 31/318547* (2013.01); *G01R 31/318583* (2013.01); *G06F 30/33* (2020.01)

(58) Field of Classification Search
USPC ................................. 716/139; 714/727, 758
See application file for complete search history.

(56) References Cited

U.S. PATENT DOCUMENTS

| | | | | |
|---|---|---|---|---|
| 6,141,781 A | * | 10/2000 | Mueller | H03M 13/35 375/225 |
| 7,818,644 B2 | | 10/2010 | Rajski et al. | |
| 7,890,827 B2 | | 2/2011 | Rajski et al. | |

(Continued)

FOREIGN PATENT DOCUMENTS

| | | | | |
|---|---|---|---|---|
| CN | 108875430 A | * | 11/2018 | |
| EP | 442616 A | * | 8/1991 | |

OTHER PUBLICATIONS

C. Barnhart, et al., "OPMISR: The foundation for compressed ATPG vectors," Proc. ITC, pp. 748-757, Nov. 2001.

(Continued)

*Primary Examiner* — Brian Ngo

(57) ABSTRACT

This application discloses a computing system implementing an automatic test pattern generation tool to perform scan chain diagnosis-driven compaction setting. The computing system can perform fault simulation on scan chains in a circuit design describing an integrated circuit, which loads test patterns to the simulated scan chains and unloads test responses from the simulated scan chains. The computing system can determine locations of sensitive bits and locations of unknown bits in each of the scan chains based on the test responses from the simulated scan chains, and generate a configuration for a compactor in the integrated circuit based, at least in part, on the locations of the sensitive bits and the locations of the unknown bits in each of the scan chains, wherein the compactor is configured to compact test responses from the scan chains in the integrated circuit based on the configuration.

20 Claims, 13 Drawing Sheets

(51) Int. Cl.
*G01R 31/3183* (2006.01)
*G06F 30/33* (2020.01)

(56) References Cited

U.S. PATENT DOCUMENTS

| | | | | |
|---|---|---|---|---|
| 8,839,184 B1* | 9/2014 | Seguine | ............... | G06F 30/34 716/139 |
| 2011/0209029 A1* | 8/2011 | Zopf | ............... | H03M 13/15 714/758 |
| 2013/0166976 A1* | 6/2013 | Huang | ............... | G06F 30/398 714/727 |
| 2018/0217204 A1* | 8/2018 | Huang | ............... | G11C 29/40 |

OTHER PUBLICATIONS

C. Barnhart, et al., "Extending OPMISR beyond 10x scan test efficiency." IEEE Design and Test, vol. 19, No. 5, pp. 65-73, Nov. 2002.
W. Cheng and Y. Huang, "Enhance Profiling-Based Scan Chain Diagnosis by Pattern Masking," 2010 19th IEEE Asian Test Symposium, Shanghai, pp. 255-260, Dec. 2010.
T. Clouqueur, H. Fujiwara, K. Zarrineh, and K. Saluja, "Design and analysis of multiple-weight linear compactors of responses containing unknown values," Proc. ITC, Nov. 2005.
R. Guo, and S. Venkataranman, "A Technique for Fault Diagnosis of Defects in Scan Chains," Proc. Int'l Test Conf., Nov. 2001, pp. 268-277.
Y. Huang et al., "Scan Chain Diagnosis by Adaptive Signal Profiling with Manufacturing ATPG Patterns," Proc. Asian Test Conf., pp. 35-40, Nov. 2009.
Y. Huang, J. Janicki, S. Urban; "Non-Adaptive Pattern Reordering to Improve Scan Chain Diagnostic Resolution," IEE European Test Symposium (ETS), Aug. 2019.
X. Lin, S.M. Reddy and W.-T. Cheng "On Achieving Maximal Chain Diagnosis Resolution through Test Pattern Selection," Proc. Asian Test Conf., pp. 132-137, Nov. 2016.
S. Mitra and K. S. Kim, "X-Compact: an efficient response compaction technique," IEEE Trans. CAD, vol. 23, pp. 421-432, Mar. 2004.
G. Mrugalski, J. Rajski, and J. Tyszer, "Test response compactor with programmable selector," in Proc. DAC, pp. 1089-1094, Sep. 2006.
J. H. Patel, S. S. Lumetta, and S. M. Reddy, "Application of Saluja-Karpovsky compactors to test responses with many unknowns," Proc. VTS, pp. 107-112, May 2003.
J. Rajski, J. Tyszer, M. Kassab, and N. Mukherjee, "Embedded deterministic test," IEEE Trans. CAD, vol. 23, pp. 776-792, May 2004.
J. Rajski, J. Tyszer, G. Mrugalski, N. Mukherjee, W.-T. Cheng, M. Kassab, "X-Press: two-stage X-tolerant compactor with programmable selector", IEEE Trans. CAD, vol. 27, pp. 147-159, Jan. 2008.
J. Rajski, J. Tyszer, C. Wang, and S. Reddy, "Convolutional compaction of test responses," Proc. ITC, pp. 745-754, Oct. 2003.
N. A. Touba, "Survey of Test Vector Compression Techniques", IEEE Design & Test, pp. 294-303, Apr. 2006.
S. Venkataraman et al., "Test Reordering for Improved Scan Chain Diagnosis using an Enhanced Defect Diagnosis Procedure," Proc. Int'l Test Conf., Nov. 2017.
C. Wang, et al., "On compacting test responses data containing unknown values," Proc. ICCAD, pp. 855-862, Nov. 2003.
H. Wang et al., "Test-data volume optimization for diagnosis," Design Automation Conference (DAC), pp. 567-572, Jun. 2012.
P. Wohl, J.A. Waicukauski, R. Kapur, S. Ramnath, E. Gizdarski, T.W. Williams, and P. Jaini, "Minimizing the impact of scan compression," 25th IEEE VLSI Test Symposium, pp. 67-74, May 2007.
S. Kundu, S. Chattopadhyay, I. Sengupta and R. Kapur, "Aggresive scan chain masking for improved diagnosis of multiple scan chain failures," 2013 18th IEEE European Test Symposium (ETS), May 2013.
L. Wang et al., "VirtualScan: Test Compression Technology Using Combinational Logic and One-Pass ATPG," IEEE Design & Test of Computers, vol. 25, No. 2, pp. 122-130, Apr. 2008.
A. Uzzaman, B. Keller and V. Chickermane, "A Scalable Architecture for On-Chip Compression: Options and Trade-Offs," 2006 15th Asian Test Symposium, pp. 132-132, Nov. 2006.

* cited by examiner

EXAMPLE TEST PATTERN RESPONSE AND OBSERVATION SITE IDENTIFICATION

TEST STIMULUS 410

| 1 | 0 | 0 | 1 | 0 | 1 |
|---|---|---|---|---|---|
| 1 | 1 | 0 | 1 | 1 | 0 |
| 0 | 1 | 1 | 0 | 1 | 1 |
| 0 | 0 | 1 | 1 | 0 | 1 |

SCAN CHAINS 401

TEST RESPONSE 420

| 0 | 0 | 1 | 1 | X | 0 |
|---|---|---|---|---|---|
| 1 | 0 | X | 1 | 1 | 0 |
| 1 | 1 | 0 | 1 | X | 0 |
| 0 | 1 | 1 | 0 | 1 | 1 |

OBSERVATION SITES 430

| - | - | 1 | 2 | X | 1 |
|---|---|---|---|---|---|
| - | 1 | X | - | 1 | 1 |
| - | - | - | 2 | X | - |
| 3 | - | - | - | 2 | - |

TEST STIMULUS 611   TEST RESPONSE 612

FAULT CONTEXT 601:

| X | X | X | X | X | X |
|---|---|---|---|---|---|
| 1 | 1 | 0 | 1 | 1 | 0 |
| 0 | 1 | 1 | 0 | 1 | 1 |
| 0 | 0 | 1 | 1 | 0 | 1 |

| 0 | X | X | 1 | X | 0 |
|---|---|---|---|---|---|
| X | 0 | X | 1 | 1 | 0 |
| 1 | X | 0 | 1 | X | 0 |
| 0 | X | X | X | 1 | X |

TEST STIMULUS 621   TEST RESPONSE 622

FAULT CONTEXT 602:

| 1 | 0 | 0 | 1 | 0 | 1 |
|---|---|---|---|---|---|
| X | X | X | X | X | X |
| 0 | 1 | 1 | 0 | 1 | 1 |
| 0 | 0 | 1 | 1 | 0 | 1 |

| 0 | X | X | X | X | 0 |
|---|---|---|---|---|---|
| X | 0 | X | X | 1 | 0 |
| X | 1 | X | 1 | X | 0 |
| 0 | X | 1 | 0 | 1 | X |

MASKED SENSITIVE BITS 651

TEST STIMULUS 631   TEST RESPONSE 632

FAULT CONTEXT 603:

| 1 | 0 | 0 | 1 | 0 | 1 |
|---|---|---|---|---|---|
| 1 | 1 | 0 | 1 | 1 | 0 |
| X | X | X | X | X | X |
| 0 | 0 | 1 | 1 | 0 | 1 |

| X | 0 | X | 1 | X | 0 |
|---|---|---|---|---|---|
| 1 | 0 | X | X | 1 | X |
| X | 1 | X | 1 | X | 0 |
| 0 | 1 | X | 0 | 1 | X |

TEST STIMULUS 641   TEST RESPONSE 642

FAULT CONTEXT 604:

| 1 | 0 | 0 | 1 | 0 | 1 |
|---|---|---|---|---|---|
| 1 | 1 | 0 | 1 | 1 | 0 |
| 0 | 1 | 1 | 0 | 1 | 1 |
| X | X | X | X | X | X |

| X | 0 | X | 1 | X | 0 |
|---|---|---|---|---|---|
| X | X | X | X | 1 | 0 |
| 1 | X | X | 1 | X | X |
| X | X | 1 | X | 1 | X |

MASKED SENSITIVE BITS 652

FAULT CONTEXT 601

TEST STIMULUS 611:
| X | X | X | X | X | X |
| 1 | 1 | 0 | 1 | 1 | 0 |
| 0 | 1 | 1 | 0 | 1 | 1 |
| 0 | 0 | 1 | 1 | 0 | 1 |

TEST RESPONSE 612:
| 0 | X | X | 1 | X | 0 |
| X | 0 | X | 1 | 1 | 0 |
| 1 | X | 0 | 1 | X | 0 |
| 0 | X | X | X | 1 | X |

FAULT CONTEXT 602

TEST STIMULUS 621:
| 1 | 0 | 0 | 1 | 0 | 1 |
| X | X | X | X | X | X |
| 0 | 1 | 1 | 0 | 1 | 1 |
| 0 | 0 | 1 | 1 | 0 | 1 |

TEST RESPONSE 622:
| 0 | X | X | X | X | 0 |
| X | 0 | X | X | 1 | 0 |
| X | 1 | X | 1 | X | 0 |
| 0 | X | 1 | 0 | 1 | X |

— MASKED SENSITIVE BITS 671

FAULT CONTEXT 603

TEST STIMULUS 631:
| 1 | 0 | 0 | 1 | 0 | 1 |
| 1 | 1 | 0 | 1 | 1 | 0 |
| X | X | X | X | X | X |
| 0 | 0 | 1 | 1 | 0 | 1 |

TEST RESPONSE 632:
| X | 0 | X | 1 | X | 0 |
| 1 | 0 | X | X | 1 | X |
| X | 1 | X | 1 | X | 0 |
| 0 | 1 | X | 0 | 1 | X |

FAULT CONTEXT 604

TEST STIMULUS 641:
| 1 | 0 | 0 | 1 | 0 | 1 |
| 1 | 1 | 0 | 1 | 1 | 0 |
| 0 | 1 | 1 | 0 | 1 | 1 |
| X | X | X | X | X | X |

TEST RESPONSE 642:
| X | 0 | X | 1 | X | 0 |
| X | X | X | X | 1 | 0 |
| 1 | X | X | 1 | X | X |
| X | X | 1 | 1 | 1 | X |

— MASKED SENSITIVE BITS 672

TEST STIMULUS 611    TEST RESPONSE 612

FAULT CONTEXT 601:

Stimulus:
| X | X | X | X | X |
| 1 | 1 | 0 | 1 | 1 | 0 |
| 0 | 1 | 1 | 0 | 1 | 1 |
| 0 | 0 | 1 | 1 | 0 | 1 |

Response:
| 0 | X | X | 1 | X | 0 |
| X | 0 | X | 1 | 1 | 0 |
| 1 | X | 0 | 1 | X | 0 |
| 0 | X | X | X | 1 | X |

SENSITIVE BITS = 3

MASKED SENSITIVE BITS = 4

TEST STIMULUS 621    TEST RESPONSE 622

FAULT CONTEXT 602:

Stimulus:
| 1 | 0 | 0 | 1 | 0 | 1 |
| X | X | X | X | X | X |
| 0 | 1 | 1 | 0 | 1 | 1 |
| 0 | 0 | 1 | 1 | 0 | 1 |

Response:
| 0 | X | X | X | X | 0 |
| X | 0 | X | X | 1 | 0 |
| X | 1 | X | 1 | X | 0 |
| 0 | X | 1 | 0 | 1 | X |

SENSITIVE BITS = 3

MASKED SENSITIVE BITS = 4

TEST STIMULUS 631    TEST RESPONSE 632

FAULT CONTEXT 603:

Stimulus:
| 1 | 0 | 0 | 1 | 0 | 1 |
| 1 | 1 | 0 | 1 | 1 | 0 |
| X | X | X | X | X | X |
| 0 | 0 | 1 | 1 | 0 | 1 |

Response:
| X | 0 | X | 1 | X | 0 |
| 1 | 0 | X | X | 1 | X |
| X | 1 | X | 1 | X | 0 |
| 0 | 1 | X | 0 | 1 | X |

SENSITIVE BITS = 3

MASKED SENSITIVE BITS = 3

TEST STIMULUS 641    TEST RESPONSE 642

FAULT CONTEXT 604:

Stimulus:
| 1 | 0 | 0 | 1 | 0 | 1 |
| 1 | 1 | 0 | 1 | 1 | 0 |
| 0 | 1 | 1 | 0 | 1 | 1 |
| X | X | X | X | X | X |

Response:
| X | 0 | X | 1 | X | 0 |
| X | X | X | X | 1 | 0 |
| 1 | X | X | 1 | X | X |
| X | X | 1 | X | 1 | X |

SENSITIVE BITS = 2

MASKED SENSITIVE BITS = 5

FIG. 6F

TEST STIMULUS 611    TEST RESPONSE 614

FAULT CONTEXT 601:
- Stimulus:
  | X | X | X | X | X | X |
  | 1 | 1 | 0 | 1 | 1 | 0 |
  | 0 | 1 | 1 | 0 | 1 | 1 |
  | 0 | 0 | 1 | 1 | 0 | 1 |
- Response:
  | 0 | X | X | 1 | X | 0 |
  | X | 0 | X | 1 | 1 | 0 |
  | 1 | X | 0 | 1 | X | 0 |
  | - | - | - | - | - | - |

SENSITIVE BITS = 3

MASKED SENSITIVE BITS = 2

TEST STIMULUS 621    TEST RESPONSE 624

FAULT CONTEXT 602:
- Stimulus:
  | 1 | 0 | 0 | 1 | 0 | 1 |
  | X | X | X | X | X | X |
  | 0 | 1 | 1 | 0 | 1 | 1 |
  | 0 | 0 | 1 | 1 | 0 | 1 |
- Response:
  | 0 | X | X | X | X | 0 |
  | X | 0 | X | X | 1 | 0 |
  | X | 1 | X | 1 | X | 0 |
  | - | - | - | - | - | - |

SENSITIVE BITS = 3

MASKED SENSITIVE BITS = 3

TEST STIMULUS 631    TEST RESPONSE 634

FAULT CONTEXT 603:
- Stimulus:
  | 1 | 0 | 0 | 1 | 0 | 1 |
  | 1 | 1 | 0 | 1 | 1 | 0 |
  | X | X | X | X | X | X |
  | 0 | 0 | 1 | 1 | 0 | 1 |
- Response:
  | X | 0 | X | 1 | X | 0 |
  | 1 | 0 | X | X | 1 | X |
  | X | 1 | X | 1 | X | 0 |
  | - | - | - | - | - | - |

SENSITIVE BITS = 3

MASKED SENSITIVE BITS = 1

TEST STIMULUS 641    TEST RESPONSE 644

FAULT CONTEXT 604:
- Stimulus:
  | 1 | 0 | 0 | 1 | 0 | 1 |
  | 1 | 1 | 0 | 1 | 1 | 0 |
  | 0 | 1 | 1 | 0 | 1 | 1 |
  | X | X | X | X | X | X |
- Response:
  | X | 0 | X | 1 | X | 0 |
  | X | X | X | X | 1 | 0 |
  | 1 | X | X | 1 | X | X |
  | - | - | - | - | - | - |

MASKED

FIG. 6G

TEST STIMULUS 611  TEST RESPONSE 615

FAULT CONTEXT 601:
Stimulus:
| X | X | X | X | X | X |
| 1 | 1 | 0 | 1 | 1 | 0 |
| 0 | 1 | 1 | 0 | 1 | 1 |
| 0 | 0 | 1 | 1 | 0 | 1 |

Response:
| 0 | X | X | 1 | X | 0 |
| X | 0 | X | 1 | 1 | 0 |
| 1 | X | 0 | 1 | X | 0 |
| - | - | - | - | - | - |

SENSITIVE BITS = 3
MASKED SENSITIVE BITS = 1

TEST STIMULUS 621  TEST RESPONSE 625

FAULT CONTEXT 602:
Stimulus:
| 1 | 0 | 0 | 1 | 0 | 1 |
| X | X | X | X | X | X |
| 0 | 1 | 1 | 0 | 1 | 1 |
| 0 | 0 | 1 | 1 | 0 | 1 |

Response:
| 0 | X | X | X | X | 0 |
| X | 0 | X | X | X | 0 |
| X | 1 | X | 1 | X | 0 |
| - | - | - | - | - | - |

SENSITIVE BITS = 2
MASKED SENSITIVE BITS = 3

TEST STIMULUS 631  TEST RESPONSE 635

FAULT CONTEXT 603:
Stimulus:
| 1 | 0 | 0 | 1 | 0 | 1 |
| 1 | 1 | 0 | 1 | 1 | 0 |
| X | X | X | X | X | X |
| 0 | 0 | 1 | 1 | 0 | 1 |

Response:
| X | 0 | X | 1 | X | 0 |
| 1 | 0 | X | X | 1 | X |
| X | 1 | X | 1 | X | 0 |
| - | - | - | - | - | - |

OBSERVED

TEST STIMULUS 641  TEST RESPONSE 645

FAULT CONTEXT 604:
Stimulus:
| 1 | 0 | 0 | 1 | 0 | 1 |
| 1 | 1 | 0 | 1 | 1 | 0 |
| 0 | 1 | 1 | 0 | 1 | 1 |
| X | X | X | X | X | X |

Response:
| X | 0 | X | 1 | X | 0 |
| X | X | X | X | 1 | 0 |
| 1 | X | X | 1 | X | X |
| - | - | - | - | - | - |

MASKED

FIG. 6H

SUSPECT RESOLUTION FOR SCAN CHAIN DEFECT DIAGNOSIS

TECHNICAL FIELD

This application is generally related to electronic design automation and, more specifically, to suspect resolution for scan chain defect diagnosis.

BACKGROUND

Since defects in integrated circuits can be introduced during manufacturing, manufacturers often test integrated circuit chips to identify faults and diagnose defects in the integrated circuit chips. Integrated circuit testing typically includes applying a set of test stimuli or test patterns to a circuit-under-test and then analyzing responses generated by the circuit-under-test. To make it easier to develop and apply test patterns, certain testability features can be added to integrated circuit designs, referred to as design for test or design for testability (DFT). In a design for test scheme, called scan chain testing, sequential state elements in integrated circuit designs, for example, latches, flip-flops, or the like, can be made controllable and observable via a serial interface. For example, the sequential state elements can be replaced with dual-purpose state elements, called scan cells, which can be connected together to form scan chains acting as serial shift registers for shifting in test patterns and shifting out test responses.

Automatic Test Equipment (ATE) can load test patterns to scan chains in a circuit-under-test and unload test responses from the scan chain in the circuit-under-test. A defect diagnosis process can utilize the test patterns and test responses from the scan chains to identify suspected defects and isolate them to particular locations in the circuit-under-test, for example, to generate a fail log, and then analyzing the fail log to locate the suspected defects. A physical failure analysis (PFA) process can be performed to determine whether the suspected defects correspond to actual defects by physically inspecting integrated circuit chips, usually by etching away certain layers of the integrated circuit chips and then imaging the silicon surface using electronic microscopy or focused ion beams. The number of actual defects determined during the PFA process relative to a number of suspected defects identified during defect diagnosis can correspond to a diagnosis resolution associated with the defect diagnosis process. As the number of suspected defect increases and the diagnosis resolution decreases, the more onerous, time-consuming, and even impractical the PFA process becomes.

As integrated circuit chips have increased in complexity, a ratio of logic to be tested per pin has increased and a volume of scan test data has consumed ATE time and memory resources. Test compression techniques can allow an Automatic Test Pattern Generation (ATPG) tool to compress a large number of generated test patterns into a smaller set of test patterns that, when applied to an integrated circuit, can be expanded, for example, by decompression logic in the integrated circuit, and loaded into scan cells in the integrated circuit. Many of these integrated circuits also include test compaction techniques to unload test responses from the scan cells, compact the test responses together for output from the integrated circuit. While these test compression and test compaction techniques can speed up test time and ATE memory consumption, it also renders failing scan cells to be no longer directly observable, only derivable from the compacted test responses. Often times, test responses unloaded from scan cells include unknown states, sometimes called X states, that when compacted with sensitive bits in the test responses, for example, bits in the test responses utilized to identify failing scan chains, can eliminate or reduce the ability to identify the failing scan chains from the compacted test responses.

SUMMARY

This application discloses a computing system implementing an automatic test pattern generation tool to perform scan chain diagnosis-driven compaction setting. The computing system can perform fault simulation on scan chains in a circuit design describing an integrated circuit, which loads test patterns to the simulated scan chains and unloads test responses from the simulated scan chains. The computing system can determine locations of sensitive bits and locations of unknown bits in each of the scan chains based on the test responses from the simulated scan chains, and generate a configuration for a compactor in the integrated circuit based, at least in part, on the locations of the sensitive bits and the locations of the unknown bits in each of the scan chains, wherein the compactor is configured to compact test responses from the scan chains in the integrated circuit based on the configuration. Embodiments of will be described below in greater detail.

DESCRIPTION OF THE DRAWINGS

FIGS. 6A-6H illustrate an example setting of scan chain test response compaction based on scan chain diagnosis according to various embodiments.

DETAILED DESCRIPTION

Illustrative Operating Environment

Figure 1:
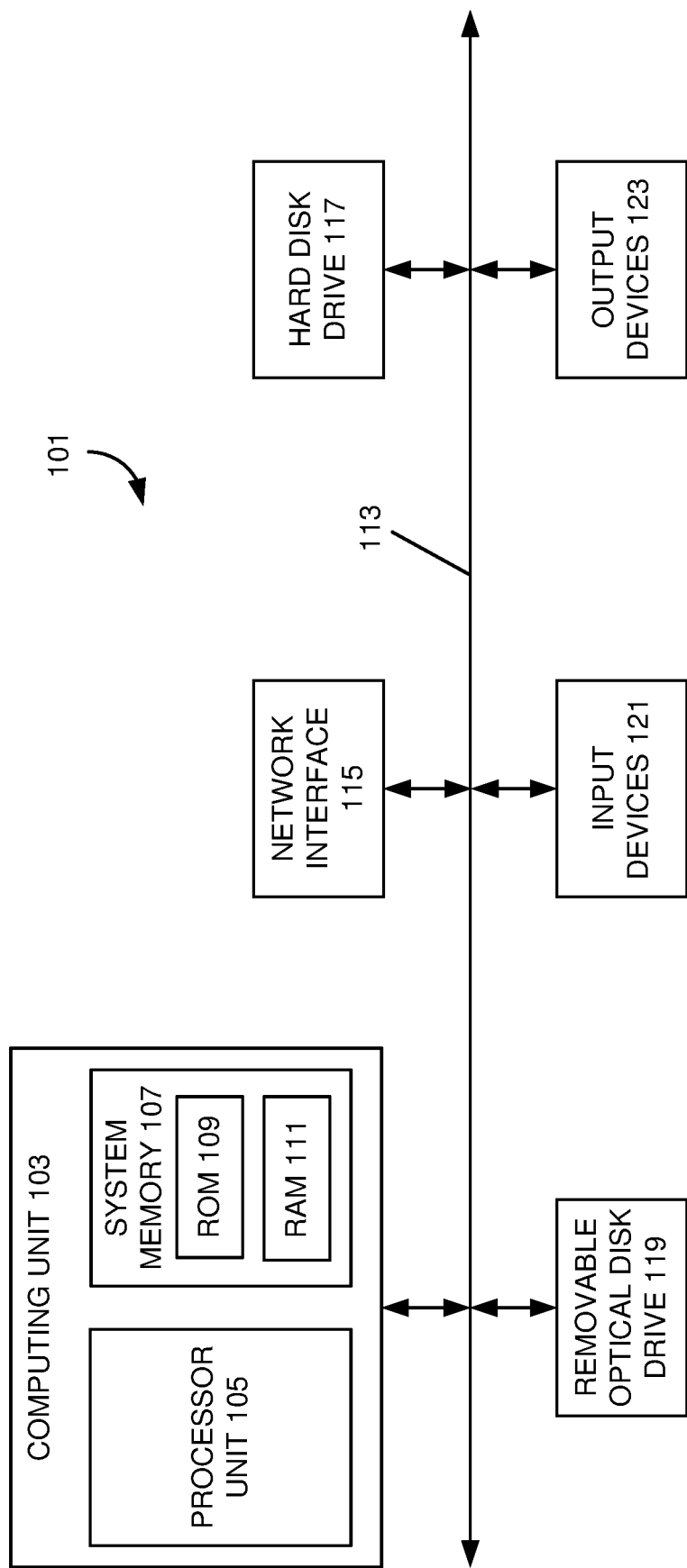
FIGS. 1 and 2 illustrate an example of a computer system of the type that may be used to implement various embodiments.

Various examples may be implemented through the execution of software instructions by a computing device 101, such as a programmable computer. Accordingly, FIG. 1 shows an illustrative example of a computing device 101. As seen in this figure, the computing device 101 includes a computing unit 103 with a processor unit 105 and a system memory 107. The processor unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processor unit 105.

The processor unit 105 and the system memory 107 are connected, either directly or indirectly, through a bus 113 or alternate communication structure, to one or more peripheral devices 115-123. For example, the processor unit 105 or the system memory 107 may be directly or indirectly connected to one or more additional memory storage devices, such as a hard disk drive 117, which can be magnetic and/or removable, a removable optical disk drive 119, and/or a flash memory card. The processor unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 115-123 may be internally housed with the computing unit 103. Alternately, one or more of the peripheral devices 115-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
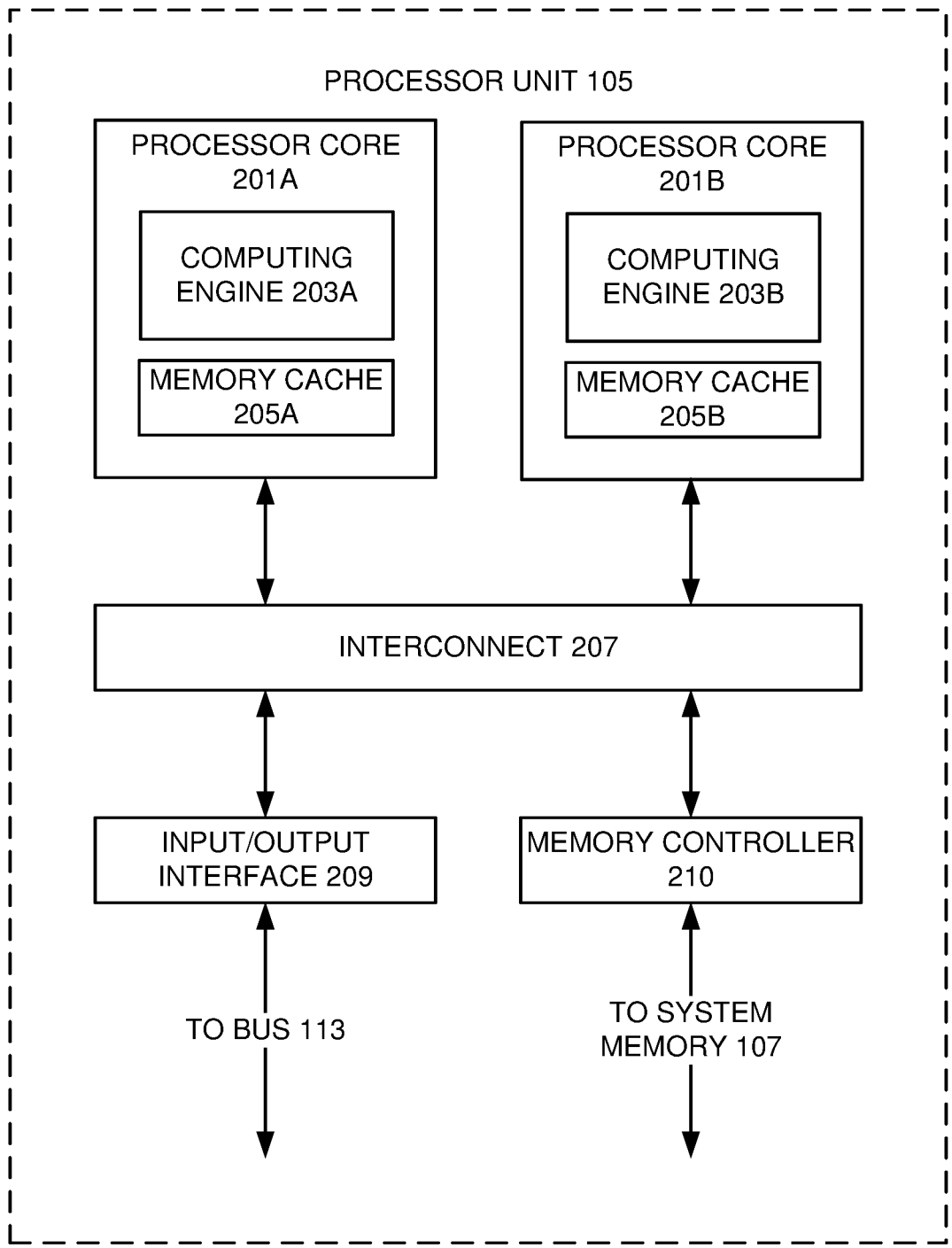

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and is not intended to suggest any limitation as to the scope of use or functionality of alternate embodiments.

Suspect Resolution for Scan Chain Defect Diagnosis

Figures 3, 4:
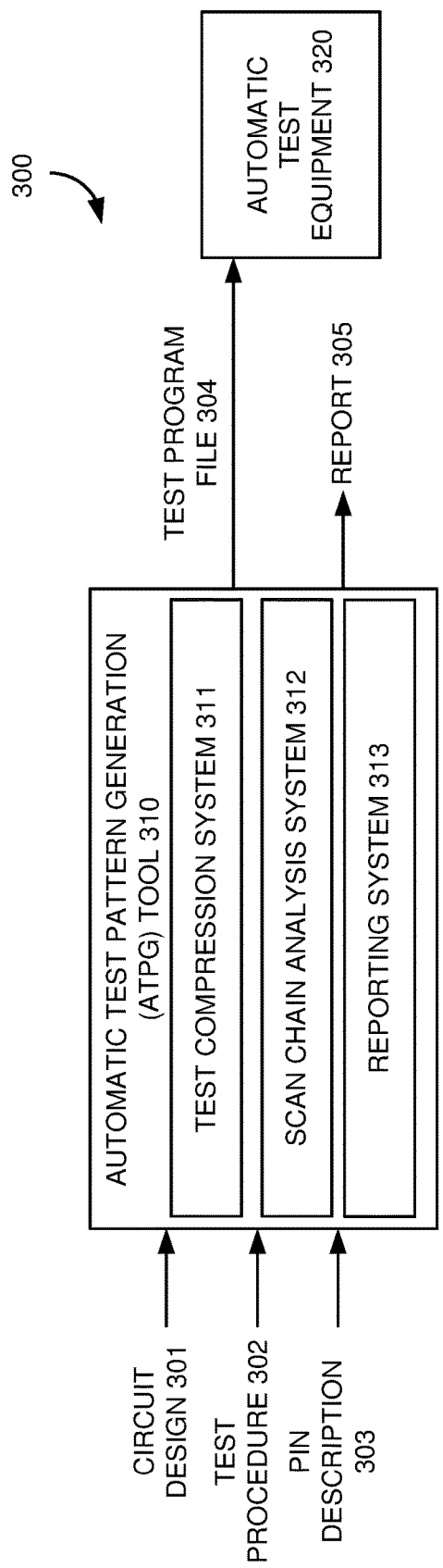
FIG. 3 illustrates an example system including an automatic test pattern generation (ATPG) tool to perform scan chain diagnosis-driven test response compaction that may be implemented according to various embodiments.
FIG. 4 illustrates example test pattern response of scan chains during fault simulation of a circuit design describing an integrated circuit according to various embodiments.
Figure 7:
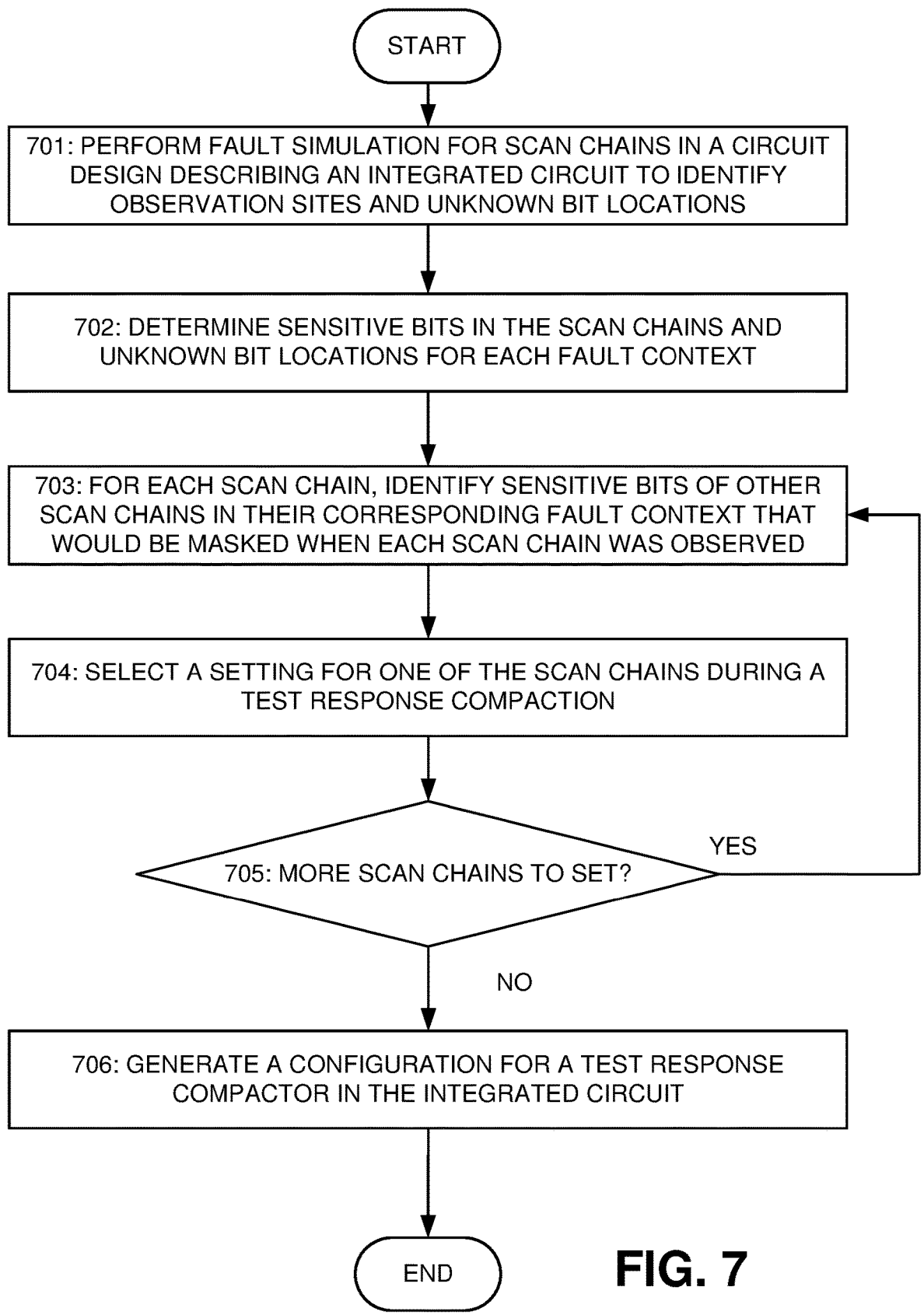
FIG. 7 illustrates a flowchart showing an example implementation of setting of scan chain test response compaction based on scan chain diagnosis according to various examples.

FIG. 3 illustrates an example system including an automatic test pattern generation (ATPG) tool 300 to perform scan chain diagnosis-driven test response compaction that may be implemented according to various embodiments. FIG. 7 illustrates a flowchart showing an example implementation of setting of scan chain test response compaction based on scan chain diagnosis according to various examples. Referring to FIGS. 3 and 7, the ATPG tool 300, for example, implemented with the computing device 101 of FIG. 1, can receive a circuit design 301 that describes an integrated circuit in a gate-level netlist format. The circuit design 301 also includes design for test circuitry, such as scan chains, which can be loaded and unloaded with test patterns to detect a presence of defects, such as a stuck-at 0 fault defect, a stuck-at 1 fault defect, or the like, in a manufactured integrated circuit. The test circuitry also can include one or more test response compactors to receive the unloaded test responses from the scan chains and to select or compact them into a compacted test response.

The ATPG tool 300 can receive a test procedure 302 that can include information about how to perform tests on the integrated circuit described by the circuit design 301. For example, the test procedure 302 can include a description of how to set input signals to the integrated circuit, locations of the scan chains and other test circuitry in the integrated circuit, locations of the clock signals, or the like. The ATPG tool 300 also can receive a pin description 303, which can describe the functionality of the pins of the integrated circuit described by the circuit design 301.

The ATPG tool 310 can generate a test program file 302 based, at least in part, on the circuit design 301, the test procedure 302, and/or the pin description 303. The test program file 302 can identify test patterns to be serially loaded into and unloaded from one or more scan chains in the integrated circuit described by the circuit design 301. For example, when attempting to determine a presence of a stuck-at 0 defect in a scan chain at a given location or scan cell, the ATPG tool 310 can generate test patterns having values of "1" shifted through the scan chain. When attempting to determine a presence of a stuck-at 1 defect, the ATPG tool 310 can generate test patterns having values of "0" shifted through the scan chain. The test program file 302 can include expected test responses to be unloaded from the one or more scan chains, which can be utilized along with actual test responses from the scan chains to identify faulty scan chains and to perform fault crediting. The test program file 302 can include at least one compactor setting that, when applied to a manufactured integrated circuit, can prompt the manufactured integrated circuit to configure at least one compactor to select or compact test responses unloaded from the scan chains into a reduced set of test responses for output from the manufactured integrated circuit. Embodiments of determining the compactor setting will be described below in greater detail.

The ATPG tool 310 can provide the test program file 302 to Automatic Test Equipment (ATE) 320, which can generate the test patterns using the test program file 302 and apply the test patterns and compactor settings to manufactured integrated circuits described by the circuit design 301. The ATE 320 can generate a fail log file, for example, in response to the applied test patterns described in the test program file 302, which can include a list of compacted test responses unloaded from scan chains, via the compactors configured with the compactor settings, which correspond to a failure and the test patterns applied to the manufactured integrated circuits to generate the test responses.

The ATPG tool 310 can include a test compression system 311 to determine test patterns to be loaded to the scan chains in the integrated circuits described by the circuit design 301. The ATPG tool 310 can compress the test patterns into compressed test patterns, for example, by combining or aggregating the test patterns into the compressed test patterns. In some embodiments, the integrated circuit described by the circuit design 301 can include test circuitry to decompress the compressed test patterns and provide then to the scan chains in the integrated circuit.

The ATPG tool 310 can include a scan chain analysis system 312 to determine compactor settings for one or more compactors in the integrated circuit, such as special compactors, convolutional compactors, temporal compactors, or the like, which can compact test responses into a reduced set of one or more test responses for output from the integrated circuit. By compacting the test responses, the test circuitry in the integrated circuit can increase test throughput and consume less memory in the ATE.

Conventional test response compaction schemes can develop compactor settings to favor having more observation sites, or bit locations in the scan chain where faults can propagate, visible in the compacted test responses. Rather than favoring more observation sites, the scan chain analysis system 312 can set compactor settings through a scan chain diagnosis-driven process, which will be described below in greater detail.

The scan chain analysis system 312 can initiate the scan chain diagnosis-driven process by, in a block 701, performing fault simulation for scan chains in the circuit design 301 to identify observation sites and unknown bit or "X" bit locations. The observation sites can correspond to bit locations in the scan chain where faults can propagate, while the unknown bit locations can bit locations in the scan chain with unknown value, for example, due to multiple clock cycle values for the observation sites. An example test pattern response of scan chains during fault simulation and identification of observation sites is shown with reference to FIG. 4.

FIG. 4 illustrates example test pattern response of scan chains during fault simulation of a circuit design describing an integrated circuit according to various embodiments. Referring to FIG. 4, a plurality of scan chains 401 are shown with test stimulus patterns 410 to be loaded into the scan chains 401, and shown with test responses 420 unloaded from the scan chains 401, for example, determined using a fault simulation of the circuit design, For example, the topmost of the scan chains can receive a test stimulus of "100101" shown in test stimulus 410, and output a test response of "0011X0" shown in test response 420. The "X" bit value in the test response can correspond to an unknown value, for example, due to multiple clock cycle effects for the scan chain. From the test responses 420 and the fault simulation, observation sites 430 can be determined for the scan chains 410. For example, in the topmost scan chain includes 3 bit locations having a total of four observation sites, associated with the numbers, i.e., 1, 2, 1 in the observation sites 430.

Referring back to FIGS. 3 and 7, the scan chain analysis system 312, in a block 702, can determine locations of sensitive bits in the scan chains and unknown bits for each fault context. The sensitive bits in the scan chains can correspond to bit locations in the scan chains having bit values that can be utilized to determine which of the scan cells within a scan chain have faults. The unknown bits can correspond to bit locations in the test response having unknown bit values due to multi-cycle effects or due to having multiple different test stimulus applied to the scan chain. In some embodiments, the fault context can correspond to which of the scan chains was targeted during the fault simulation with different test stimulus. Embodiment of a fault context will be described below with reference to FIGS. 5A-5C.

The scan chain analysis system 312, in some embodiments, elects to drop a scan chain or end the scan chain-diagnosis driven compaction setting process based on a number of sensitive bits identified for each fault context. For example, when the scan chain has a new sensitive bit count below 2% of the scan chain length, the scan chain can be dropped from the scan chain-diagnosis driven compaction setting process. In another example, when none of the scan chains have at least 10% newly identified sensitive bits, the scan chain-diagnosis driven compaction setting process can end and an observation site-based masking process can be performed instead.

Figure 5A:
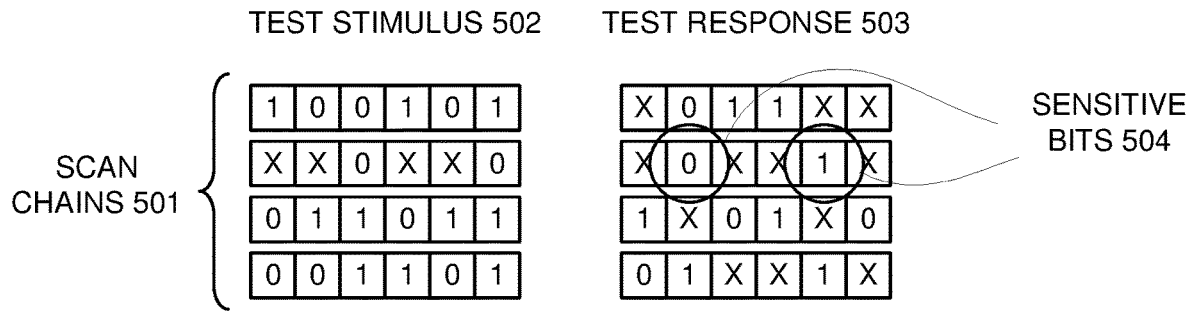
FIGS. 5A-5C illustrate example identification of sensitive bits for various scan chain faults according to various embodiments.
Figure 5B:
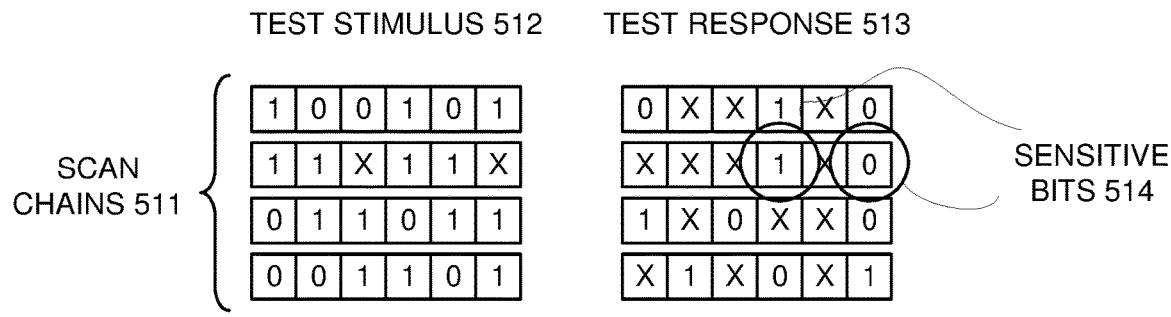
Figure 5C:
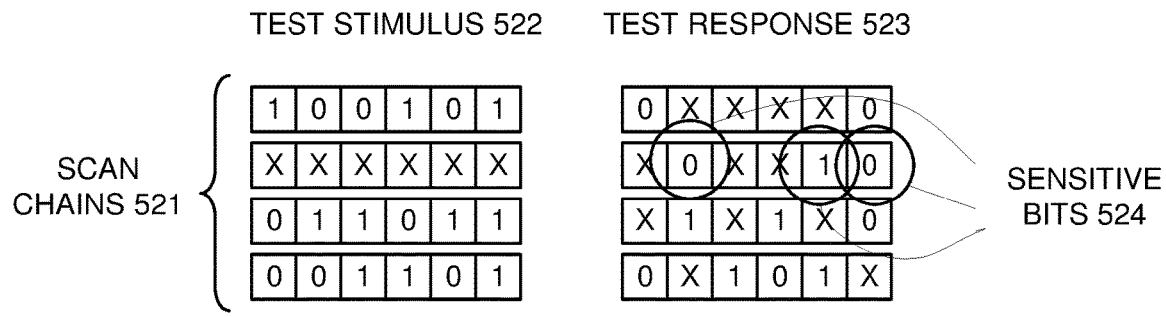

FIGS. 5A-5C illustrate example identification of sensitive bits for various scan chain faults according to various embodiments. Referring to FIG. 5A, multiple scan chains 501 can receive test stimulus 502 and output test responses. In this example, the scan chain second from the top in scan chains 501 can be targeted in for a stuck-at 0 fault, meaning the test stimulus 502 provided to the scan chains 501 can include "X" bits in the test pattern provided to the targeted scan chain. In some embodiments, the test pattern in the test stimulus 502 corresponding to the targeted scan chain can replace the "1" values with "X" values for a stuck-at 0 fault, as the "1" values could possibly change values when the targeted scan chain suffers from a stuck-at 0 fault.

The test response 503 unloaded from the scan chains 501 can include sensitive bits 504 in the targeted scan chain. In some embodiments, the sensitive bits 504 can have numerical values in the test response 503 rather than unknown bit values, list with "X" bits in the test response 503.

Referring to FIG. 5B, the scan chains 511 can be similar to the scan chains 501 of FIG. 5A except the targeted scan chain can targeted for a stuck-at 1 fault, meaning the test pattern replaced "0" in the test stimulus 512 for the targeted scan chain with "X" bit values, as the "0" values could possibly change values when the targeted scan chain suffers from a stuck-at 1 fault. The scan chains 511 can be loaded with the test stimulus 512, and a test response 513 unloaded from the scan chains 511 can include sensitive bits 514 in the targeted scan chain. In some embodiments, the sensitive bits 514 can have numerical values in the test response 513 rather than unknown bit values, list with "X" bits in the test response 513.

Referring to FIG. 5C, the scan chains 521 can be similar to the scan chains 501 of FIG. 5A and scan chains 511 of FIG. 5B except the targeted scan chain can targeted for an indeterminate fault. In this example, the test pattern applied to the targeted scan chain can comprise all "X" bits. The test response 523 associated with an application of an indeterminate fault can correspond to a fault context for the targeted scan chain.

The scan chains 521 can be loaded with the test stimulus 522, and a test response 523 unloaded from the scan chains 521 can include sensitive bits 524 in the targeted scan chain. In some embodiments, the sensitive bits 524 can have numerical values in the test response 523 rather than unknown bit values, list with "X" bits in the test response 523. To identify another fault context, a different scan chain can be targeted with test stimulus corresponding to an indeterminate fault, and the resulting test response 523 can correspond to a fault context for that targeted scan chain.

Referring back to FIGS. 3 and 7, the scan chain analysis system 312 can determine the sensitive bits, in some embodiments, using a target function shown in Equation 1.

$$S_i = \sum\nolimits_{c \in B(i)} 2^{-N_c(i)} - \sum\nolimits_{j=i} \sum\nolimits_{\substack{c \in B(j) \\ c \in X_j(i)}} N_c(j)^{-1} \quad \text{Equation 1}$$

In Equation 1, the sensitive bits $S_i$ can be determined using sets of flip-flops B(i) in scan chain i and the unknown states $X_j(i)$ for bit locations in the scan chains. The subscript index j corresponding to the set of unknowns represents the fault context associated with the target scan chain for which the simulation was performed. The number of X states $N_c(i)$ captured by scan cells belonging to scan-out cycle c can be considered for each scan chain i. An example of the sensitive bit determination is shown below with reference to FIG. 6A.

Figure 6A:
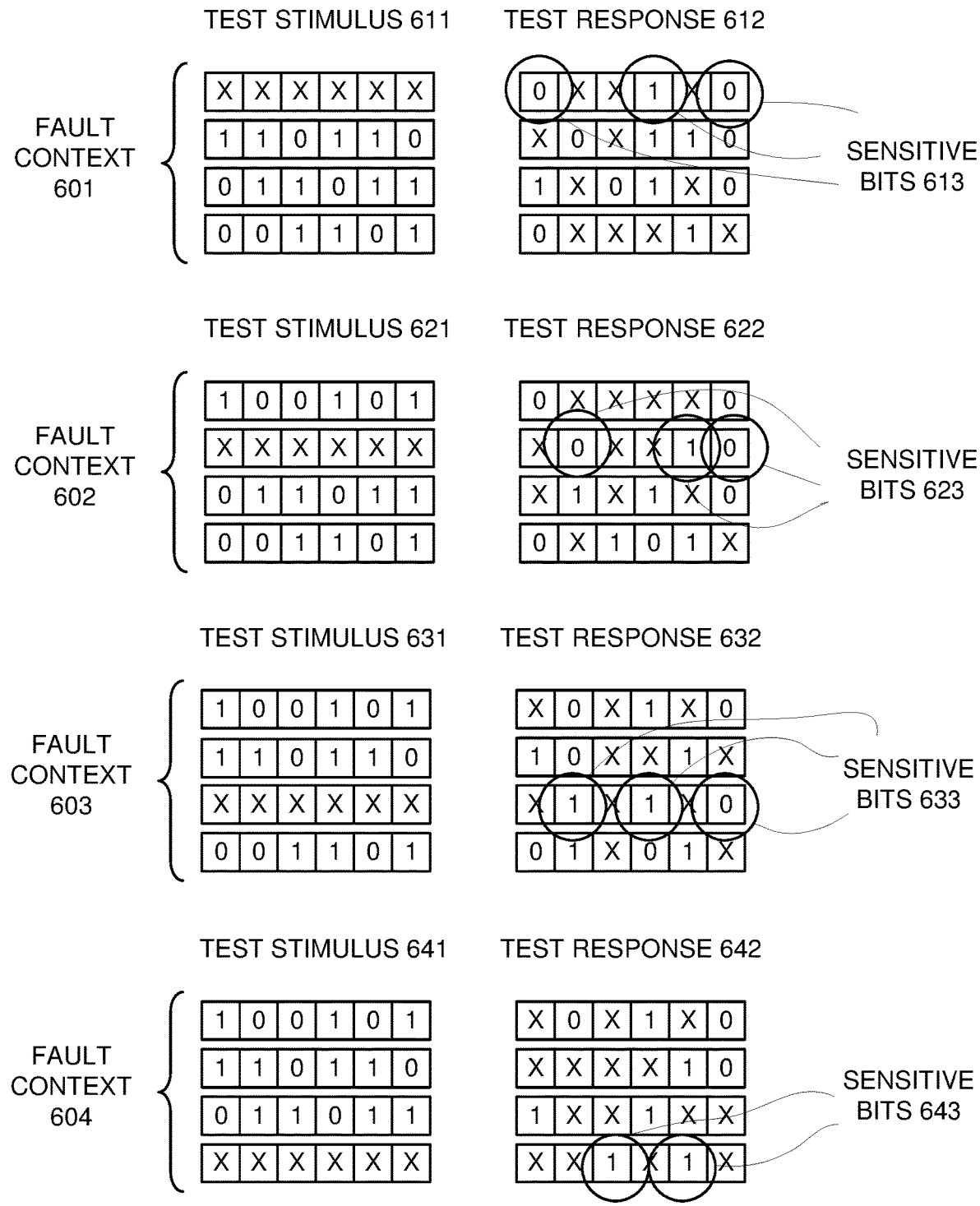

FIG. 6A illustrate an example of identifying sensitive bits for targeted scan chains in different fault contexts according to various embodiments. Referring to FIG. 6A, scan chains are shown in multiple different fault contexts 601-604, one for each targeted scan chain. For example, in fault context 601, the topmost scan chain has been targeted by providing an indeterminate test pattern, e.g., all "X" bits", as test stimulus 611. Other scan chains individually targeted in the other fault contexts 602-604 can similarly be provided indeterminate test patterns, e.g., all "X" bits", as test stimulus 621-641, respectively. The scan chains can be simulated with the test stimulus 611-641 to determine test responses 612-642, respectively. In each fault context 601-604, a number of sensitive bits 613-643, respectively, can be determined for each targeted scan chain.

Referring back to FIGS. 3 and 7, the scan chain analysis system 312, in a block 703, can, for each scan chain, identify sensitive bits of other scan chains in their corresponding fault context that would be masked when each scan chain was observed. When deciding whether to compact test responses for scan chains together, the scan chain analysis system 312 can determine whether a compaction would merge a sensitive bit from one scan chain with an unknown or "X" value in another scan chain, losing the ability to use the sensitive bit in any subsequent failure analysis for the scan chain.

The scan chain analysis system 312 can identify sensitive bits of other scan chains in their corresponding fault context that would be masked when each scan chain was observed, in some embodiments, using a target function shown in Equation 2.

$$M_i = \sum\nolimits_{j=i} \sum\nolimits_{\substack{c \in B(j) \\ c \in X_j(i)}} 2^{-(N_c(j)-1)} - \sum\nolimits_{c \in B(i)} (N_c(i)+1)^{-1} \quad \text{Equation 2}$$

In Equation 2, the masking of sensitive bits $M_i$ can be determined using sets of flip-flops B(i) in scan chain i and the unknown states $X_j(i)$ for bit locations in the scan chains. The subscript index j corresponding to the set of unknowns represents the fault context associated with the target scan chain for which the simulation was performed. The number of X states $N_c(i)$ captured by scan cells belonging to scan-out cycle e can be considered for each scan chain i. An example of the sensitive bit determination is shown below with reference to FIGS. 6B-6F.

FIGS. 6B-6F illustrate an example identification of sensitive bits of other scan chains in their corresponding fault context that would be masked when each scan chain was observed according to various embodiments. Referring to FIG. 6B-6F, the fault contexts 601-604, the test stimulus 611-641, and the test responses 612-642 can be similar as described above with reference to FIG. 6A, except the test responses 612-642 can be analyzed to identify any masked sensitive bits exist for each fault context.

In FIG. 6B, the fault context 601 can be associated with four masked sensitive bits 651 and 652. To determine whether the topmost scan chain targeted in the fault context 601 would mask out any sensitive bits of the other fault contexts 602-604, a comparison of the test responses 622-642 of the topmost scan chain can be compared to the target scan chain in the corresponding fault contexts 602-604. For example, in fault context 602, the targeted scan chain— second from the top—can have three sensitive bits. When those sensitive bits are compared to the test response 622 for the topmost scan chain, two of the sensitive bits would be masked due to X values in the topmost test response 622, corresponding to the masked sensitive bits. Similar comparisons of sensitive bits of targeted scan chains in their corresponding fault contexts 603 and 604 can be made against the test responses 632 and 642 of the topmost scan chain to identify masking of any sensitive bits. In the test response 642, the targeted scan chain—bottom scan chain— has two masked sensitive bits 652. The masked sensitive bits 651 and 652 can be accumulated and entered into fault context 601, shown in FIG. 6F.

Figure 6C:
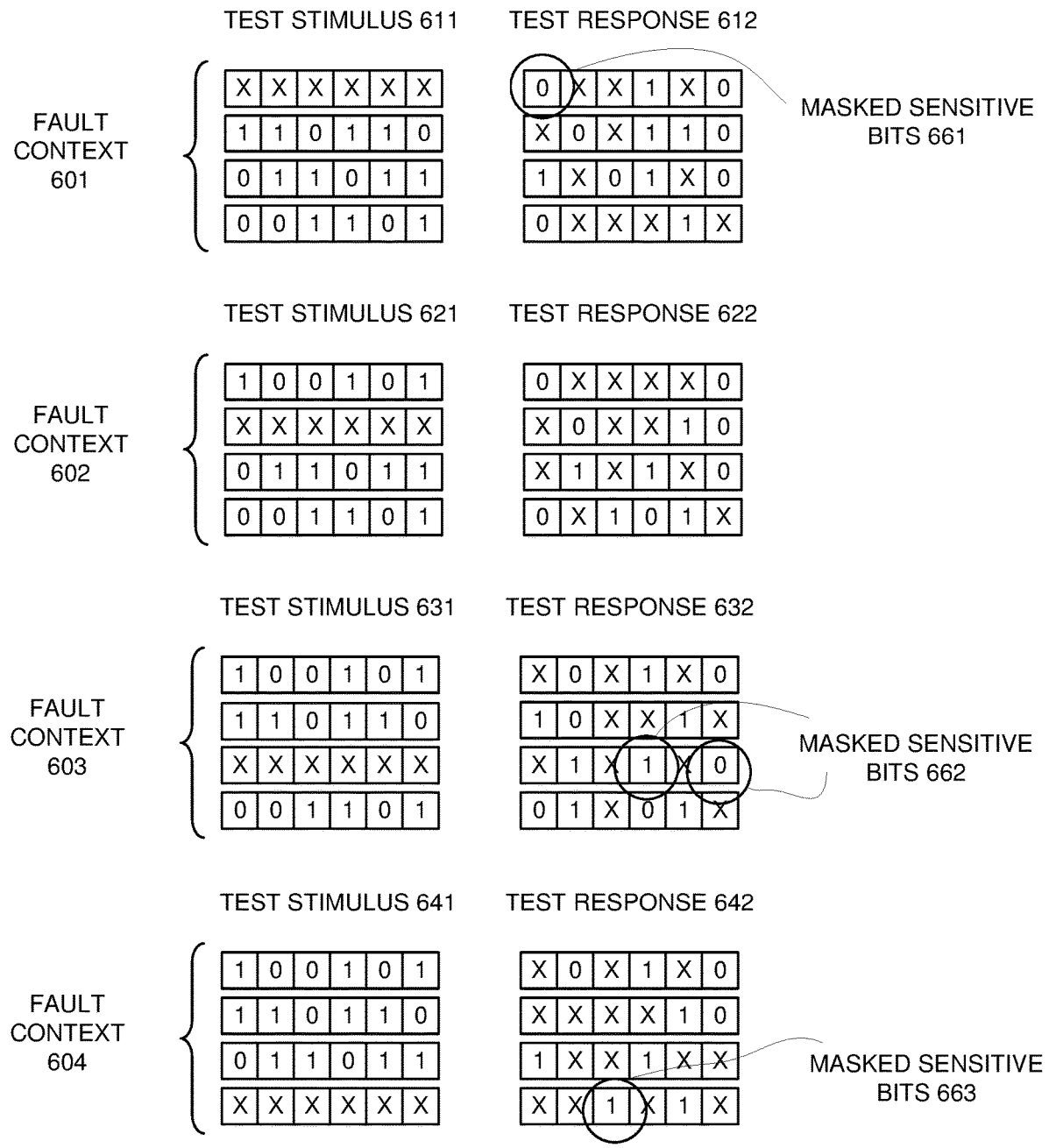

In FIG. 6C, the fault context 602 can be found to have masked sensitive bits 661-663 in fault contexts 601, 603, and 604, respectively. The masked sensitive bits 661-663 can be accumulated and entered into fault context 602, shown in FIG. 6F.

In FIG. 6D, the fault context 603 can be found to have masked sensitive bits 671 and 672 in fault contexts 601, 602, and 604, respectively. The masked sensitive bits 671 and 672 can be accumulated and entered into fault context 603, shown in FIG. 6F.

Figure 6E:
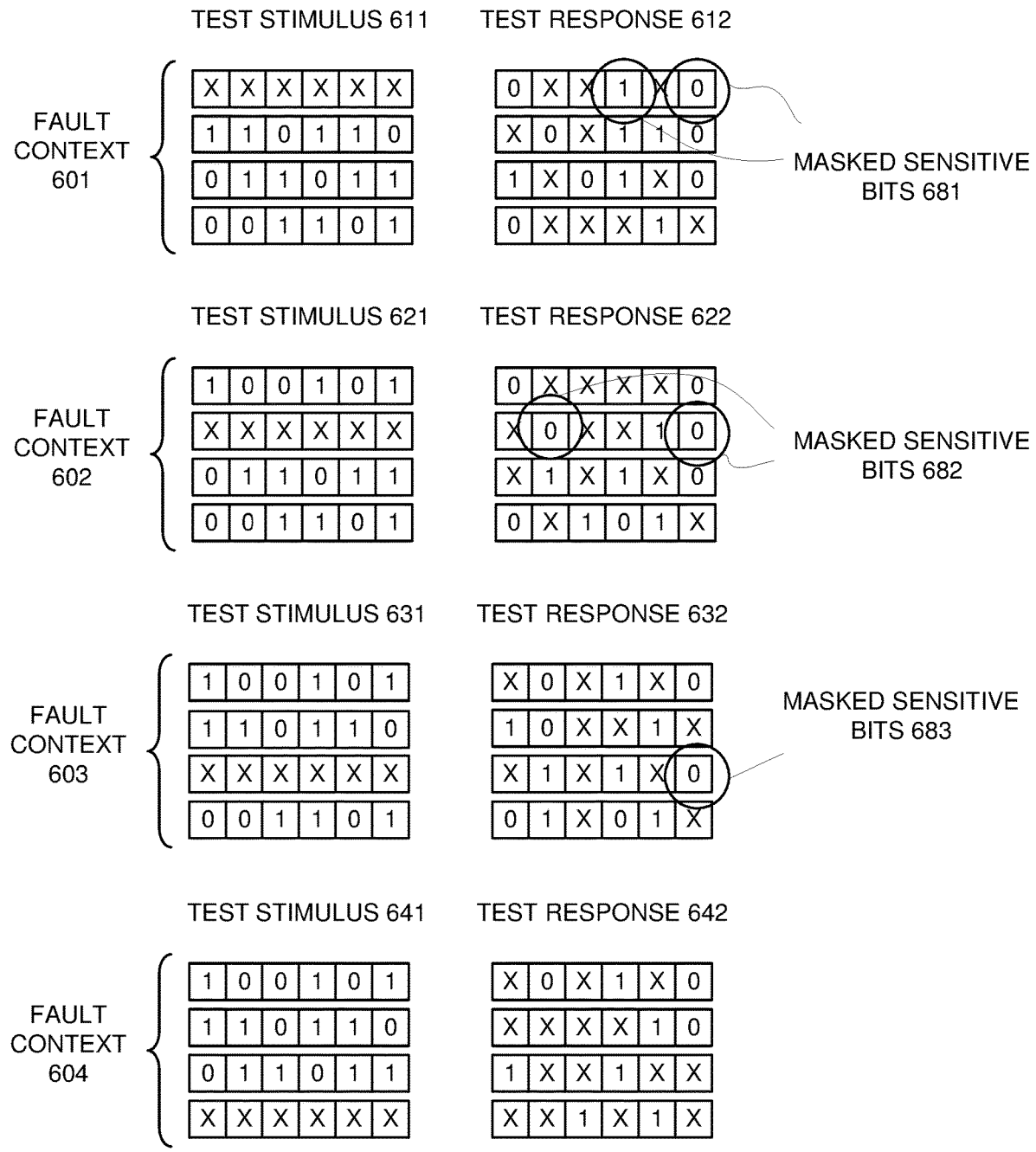

In FIG. 6E, the fault context 604 can be found to have masked sensitive bits 681-683 in fault contexts 601-603, respectively. The masked sensitive bits 681-683 can be accumulated and entered into fault context 604, shown in FIG. 6F.

Referring back to FIGS. 3 and 7, the scan chain analysis system 312, in a block 704, can select a setting for one of the scan chain during a test response compaction. In some embodiments, the scan chain analysis system 312 can utilize the sensitive bits in the test responses for each fault context to select one of the scan chains to set as a masked scan chain or as an observable scan chain during test response compaction. In some embodiments, the scan chain analysis system 312 determine a difference between the sensitive bits and masked sensitive bits associated with each fault context, select a fault context having the largest absolute difference, and set a scan chain that was targeted in the selected fault context. For example, when the selected fault context had a negative difference between the sensitive bits and masked sensitive bits, the scan chain analysis system 312 can set the scan chain that was targeted in the selected fault context to be masked. When the selected fault context had a positive difference between the sensitive bits and masked sensitive bits, the scan chain analysis system 312 can set the scan chain that was targeted in the selected fault context to be observed.

When, in a decision block 705, the scan chain analysis system 312 determines more scan chain can be set by the scan chain analysis system 312, execution can return to block 703, where the fault contexts can be modified based on the setting of the scan chain and to identify new test responses for the fault contexts targeting unmasked scan chains. Embodiments of setting the scan chains as masked or observable based on sensitive bits and masked sensitive bits will be described with reference to FIGS. 6F-6H.

FIGS. 6G-6H illustrate an example setting of scan chain test response compaction based on scan chain diagnosis according to various embodiments. Referring to FIG. 6F, the fault contexts 601-604, the test stimulus 611-641, and the test responses 612-642 can be similar as described above with reference to FIG. 6A. The fault contexts 601-604 can have sensitive bit totals determined with reference to FIG. 6A and masked sensitive bit totals determined with reference to FIGS. 6B-6E above. Differences between the sensitive bits and the masked sensitive bits, for example, the sensitive bits minus the masked sensitive bits, can be utilized to determine which of the scan chains to set as masked or observable. In this example, the fault context 604 has the largest absolute difference between the sensitive bits and the masked sensitive bits, so the bottom scan chain targeted in fault context 604 can be set as either masked or observed. Since the sensitive bits minus the masked sensitive bits corresponds to a negative number, the bottom scan chain targeted in fault context 604 can be set as a masked scan chain in a compaction process. The masking of the scan chain can indicate that the compaction of the test responses excludes the scan chain from influencing the output of the compactor or that a test response unloaded from that scan chain has been masked by the compactor.

Referring to FIG. 6G, the fault contexts 601-604 and the test stimulus 611-641, can be similar as described above with reference to FIG. 6A, but a re-computation or adjustment of the fault contexts 601-604 can be performed with the fault context masked to generate the test responses 614-644. The fault contexts 601-603 can have sensitive bit totals determined similar to how the sensitive bit totals were determined with reference to FIG. 6A. The fault contexts 601-603 also can have masked sensitive bit totals determined similar to how the masked sensitive bit totals were determined with reference to FIGS. 6B-6E except the masked scan chain associated with fault context 604 can be excluded.

Differences between the sensitive bits and the masked sensitive bits, for example, the sensitive bits minus the masked sensitive bits, can be utilized to determine which of the scan chains to set as masked or observable. In this example, the fault context 603 has the largest absolute difference between the sensitive bits and the masked sensitive bits, so the second from the bottom scan chain targeted in fault context 603 can be set as either masked or observed. Since the sensitive bits minus the masked sensitive bits corresponds to a positive number, the second from the bottom scan chain targeted in fault context 603 can be set as an observable scan chain in a compaction process. Rendering a scan chain observable can indicate that the compaction of the test responses allows the scan chain to influence the output of the compactor.

Referring to FIG. 6H, the fault contexts 601-604 and the test stimulus 611-641, can be similar as described above with reference to FIG. 6A, but a re-simulation of the fault contexts 601-604 can be performed with the fault context masked to generate the test responses 615-645. The fault contexts 601 and 602 can have sensitive bit totals determined similar to how the sensitive bit totals were determined with reference to FIG. 6A. The fault contexts 601 and 602 also can have masked sensitive bit totals determined similar to how the masked sensitive bit totals were determined with reference to FIGS. 6B-6E except the masked scan chain associated with fault context 604 can be excluded.

Differences between the sensitive bits and the masked sensitive bits, for example, the sensitive bits minus the masked sensitive bits, can be utilized to determine which of the scan chains to set as masked or observable. In this example, the fault context 601 has the largest absolute difference between the sensitive bits and the masked sensitive bits, so the second from the bottom scan chain targeted in fault context 601 can be set as either masked or observed. Since the sensitive bits minus the masked sensitive bits corresponds to a positive number, the second from the bottom scan chain targeted in fault context 601 can be set as an observable scan chain in a compaction process. Rendering a scan chain observable can indicate that the compaction of the test responses allows the scan chain to influence the output of the compactor. Since the last unset scan chain targeted by the fault context 602 has a negative difference between the sensitive bits and the masked sensitive bits, the scan chain targeted in fault context 602 can be set as a masked scan chain in a compaction process.

Referring back to FIGS. 3 and 7, when, in a decision block 705, the scan chain analysis system 312 determines all of the scan chains have been set as either masked scan chains or observable scan chains, execution can proceed to a block 706, where the scan chain analysis system 312 can generate a configuration for a test response compactor in the integrated circuit. In some embodiments, the configuration generated by the scan chain analysis system 312 can prompt the test response compactor in the integrated circuit to compact the scan chains set as observable, while making the scan chains set as masked. The configuration of the test response compactor can be incorporated into the test program file 304, which can be provided to the ATE 320 for use during testing of manufactured integrated circuits described by the circuit design 301.

The ATPG tool 310 can include a reporting system 313 to generate a report 305 corresponding to results of the configuration of the test response compactors, such as the number of sensitive bits found in each scan chain, a number of masked sensitive bits for each scan chain, a determination of masking or observing the scan chains, or the like. In some embodiments, the ATE 320 can generate a fail log file, for example, in response to the applied test patterns described in the test program file 302, which can include a list of compacted test responses unloaded from scan chains, via the compactors configured with the compactor settings, which correspond to a failure and the test patterns applied to the manufactured integrated circuits to generate the test responses. The ATPG tool 310 can utilize the fail log file to identify scan chains identified as having failures based on the compacted test responses and include the failed scan chains, a diagnosis of the failures, or the like, in the report 305.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to design processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   performing, by a computing system, fault simulation on scan chains in a circuit design describing an integrated circuit, which loads test patterns to the simulated scan chains and unloads test responses from the simulated scan chains;
   determining, by the computing system, locations of sensitive bits and locations of unknown bits in each of the scan chains based on the test responses from the simulated scan chains; and
   generating, by the computing system, a configuration for a compactor in the integrated circuit based, at least in part, on the locations of the sensitive bits and the locations of the unknown bits in each of the scan chains, wherein the compactor is configured to compact test responses from the scan chains in the integrated circuit based on the configuration.

2. The method of claim 1, wherein the compactor utilizes the configuration to selectively mask the test responses from the scan chains in the integrated circuit during a compaction of the test responses for output from the integrated circuit.

3. The method of claim 1, further comprising identifying, by the computing system, masked sensitive bits corresponding the sensitive bits that would be masked during compaction of the test responses based, at least in part, on the locations of the sensitive bits and the locations of the unknown bits in each of the scan chains.

4. The method of claim 3, further comprising determining, by the computing system, a difference between a total number of the sensitive bits and a total number of masked sensitive bits for each of the scan chains, wherein generating the configuration for the compactor in the integrated circuit is based, at least in part, on the difference between the total number of the sensitive bits and a total number of masked sensitive bits for each of the scan chains.

5. The method of claim 4, further comprising selecting, by the computing system, one of the scan chains to set in the configuration based on a magnitude of the difference between the total number of the sensitive bits and a total number of masked sensitive bits for each of the scan chains.

6. The method of claim 4, further comprising setting, by the computing system, one of the scan chains to set to masked in the configuration based on a polarity of the difference between the total number of the sensitive bits and a total number of masked sensitive bits for each of the scan chains.

7. The method of claim 1, wherein the compactor is at least one of a combination compactor to compact the test responses spatially based on the configuration, a finite input response compactor to compact the test responses through convolution based on the configuration, or an infinite input response compactor to compact the test responses temporally based on the configuration.

8. A system comprising:
a memory system configured to store computer-executable instructions; and
a computing system, in response to execution of the computer-executable instructions, is configured to:
perform fault simulation on scan chains in a circuit design describing an integrated circuit, which loads test patterns to the simulated scan chains and unloads test responses from the simulated scan chains;
determine locations of sensitive bits and locations of unknown bits in each of the scan chains based on the test responses from the simulated scan chains; and
generate a configuration for a compactor in the integrated circuit based, at least in part, on the locations of the sensitive bits and the locations of the unknown bits in each of the scan chains, wherein the compactor is configured to compact test responses from the scan chains in the integrated circuit based on the configuration.

9. The system of claim 8, wherein the compactor utilizes the configuration to selectively mask the test responses from the scan chains in the integrated circuit during a compaction of the test responses for output from the integrated circuit.

10. The system of claim 8, wherein the computing system, in response to execution of the computer-executable instructions, is further configured to identify masked sensitive bits corresponding the sensitive bits that would be masked during compaction of the test responses based, at least in part, on the locations of the sensitive bits and the locations of the unknown bits in each of the scan chains.

11. The system of claim 10, wherein the computing system, in response to execution of the computer-executable instructions, is further configured to:
determine a difference between a total number of the sensitive bits and a total number of masked sensitive bits for each of the scan chains; and
generate the configuration for the compactor in the integrated circuit based, at least in part, on the difference between the total number of the sensitive bits and a total number of masked sensitive bits for each of the scan chains.

12. The system of claim 11, wherein the computing system, in response to execution of the computer-executable instructions, is further configured to select one of the scan chains to set in the configuration based on a magnitude of the difference between the total number of the sensitive bits and a total number of masked sensitive bits for each of the scan chains.

13. The system of claim 11, wherein the computing system, in response to execution of the computer-executable instructions, is further configured to set one of the scan chains to set to masked in the configuration based on a polarity of the difference between the total number of the sensitive bits and a total number of masked sensitive bits for each of the scan chains.

14. An apparatus comprising at least one computer-readable memory device storing instructions configured to cause one or more processing devices to perform operations comprising:
performing, by a computing system, fault simulation on scan chains in a circuit design describing an integrated circuit, which loads test patterns to the simulated scan chains and unloads test responses from the simulated scan chains;
determining, by the computing system, locations of sensitive bits and locations of unknown bits in each of the scan chains based on the test responses from the simulated scan chains; and
generating, by the computing system, a configuration for a compactor in the integrated circuit based, at least in part, on the locations of the sensitive bits and the locations of the unknown bits in each of the scan chains, wherein the compactor is configured to compact test responses from the scan chains in the integrated circuit based on the configuration.

15. The apparatus of claim 14, wherein the compactor utilizes the configuration to selectively mask the test responses from the scan chains in the integrated circuit during a compaction of the test responses for output from the integrated circuit.

16. The apparatus of claim 14, wherein the instructions are configured to cause one or more processing devices to perform operations further comprising identifying masked sensitive bits corresponding the sensitive bits that would be masked during compaction of the test responses based, at least in part, on the locations of the sensitive bits and the locations of the unknown bits in each of the scan chains.

17. The apparatus of claim 16, wherein the instructions are configured to cause one or more processing devices to perform operations further comprising:
determining a difference between a total number of the sensitive bits and a total number of masked sensitive bits for each of the scan chains; and
generating the configuration for the compactor in the integrated circuit based, at least in part, on the difference between the total number of the sensitive bits and a total number of masked sensitive bits for each of the scan chains.

18. The apparatus of claim 17, wherein the instructions are configured to cause one or more processing devices to perform operations further comprising selecting one of the scan chains to set in the configuration based on a magnitude of the difference between the total number of the sensitive bits and a total number of masked sensitive bits for each of the scan chains.

19. The apparatus of claim 17, wherein the instructions are configured to cause one or more processing devices to perform operations further comprising setting one of the scan chains to set to masked in the configuration based on a polarity of the difference between the total number of the sensitive bits and a total number of masked sensitive bits for each of the scan chains.

20. The apparatus of claim 14, wherein the compactor is at least one of a combination compactor to compact the test responses spatially based on the configuration, a finite input response compactor to compact the test responses through convolution based on the configuration, or an infinite input response compactor to compact the test responses temporally based on the configuration.

* * * * *